United States Patent
Zhou et al.

(10) Patent No.: US 10,964,764 B2
(45) Date of Patent: Mar. 30, 2021

(54) DISPLAY PANEL AND METHOD OF MANUFACTURING THEREOF

(71) Applicant: Shenzhen China Star Optoelectronics Semiconductor Display Technology Co., Ltd., Guangdong (CN)

(72) Inventors: Fen Zhou, Guangdong (CN); Jia Tang, Guangdong (CN)

(73) Assignee: Shenzhen China Star Optoelectronics Semiconductor Display Technology Co., Ltd., Guangdong (CN)

(*) Notice: Subject to any disclaimer, the term of this patent is extended or adjusted under 35 U.S.C. 154(b) by 0 days.

(21) Appl. No.: 16/609,225

(22) PCT Filed: Aug. 19, 2019

(86) PCT No.: PCT/CN2019/101358
§ 371 (c)(1),
(2) Date: Oct. 29, 2019

(87) PCT Pub. No.: WO2021/000386
PCT Pub. Date: Jan. 7, 2021

(65) Prior Publication Data
US 2021/0005685 A1 Jan. 7, 2021

(30) Foreign Application Priority Data
Jul. 1, 2019 (CN) .......................... 201910583373.9

(51) Int. Cl.
*H01L 27/32* (2006.01)
*H01L 51/50* (2006.01)
*H01L 51/56* (2006.01)

(52) U.S. Cl.
CPC ...... *H01L 27/3246* (2013.01); *H01L 27/3265* (2013.01); *H01L 51/50* (2013.01); *H01L 51/56* (2013.01); *H01L 2227/323* (2013.01)

(58) Field of Classification Search
CPC ............ H01L 27/3246; H01L 27/3295; H01L 27/3265; H01L 51/50
See application file for complete search history.

(56) References Cited

U.S. PATENT DOCUMENTS

| | | | |
|---|---|---|---|
| 8,089,065 B2* | 1/2012 | Whiting | H01L 51/052 257/40 |
| 2011/0198596 A1* | 8/2011 | Park | H01L 27/3246 257/59 |
| 2019/0221621 A1* | 7/2019 | Cui | H01L 27/3246 |

\* cited by examiner

*Primary Examiner* — Jose R Diaz
(74) *Attorney, Agent, or Firm* — Mark M. Friedman

(57) ABSTRACT

A display panel and a method of manufacturing thereof are provided. The pixel defining block is formed by one-time exposing the column spacer column and the bank with a halftone mask, thereby omitting the process of individually forming the bank, and manufacturing time and manufacturing cost are reduced. The organic functional layer disposed above the bank is not directly contacted with the first electrode due to the bank structure, and the bank causes the defined region to be disconnected from the first electrode, and no current flows through the defined region. Thus, the defined region does not emit light, and the pixel region emits uniform light. The material of the bank is an organic photoresist, so hydrogen and oxygen are not introduced into the bank, and therefore not affect the thin film transistor, and improves stability of the display panel.

9 Claims, 5 Drawing Sheets

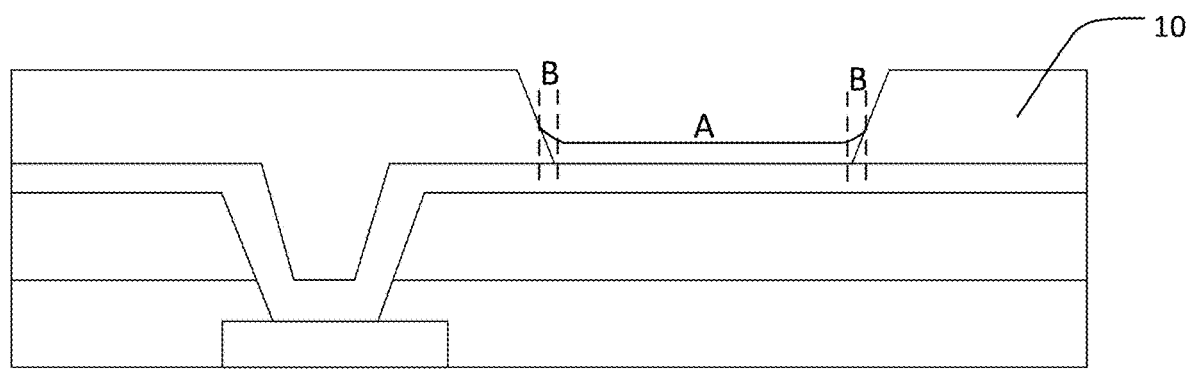
FIG. 1, Prior Art
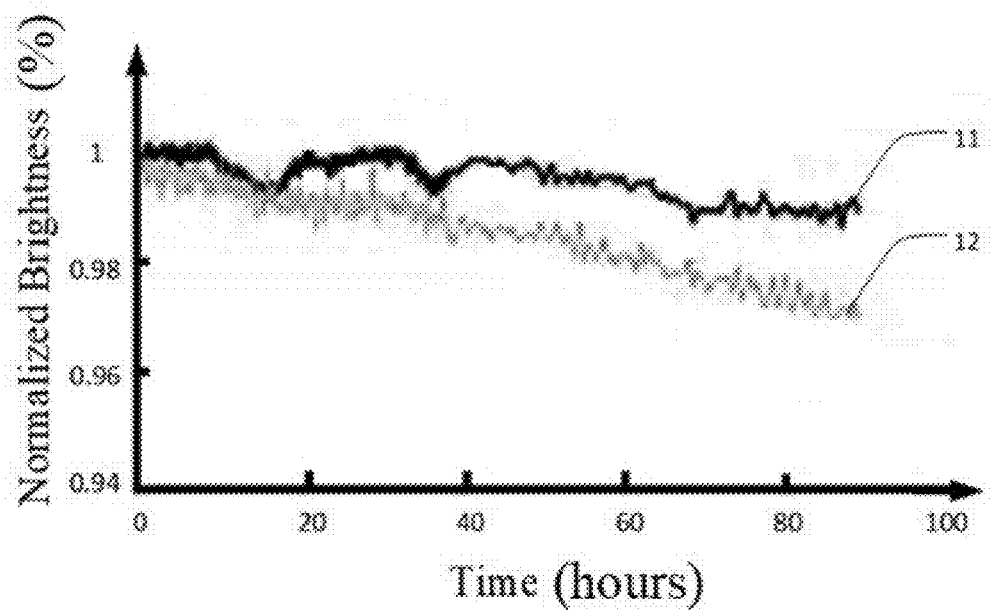
FIG. 2, Prior Art

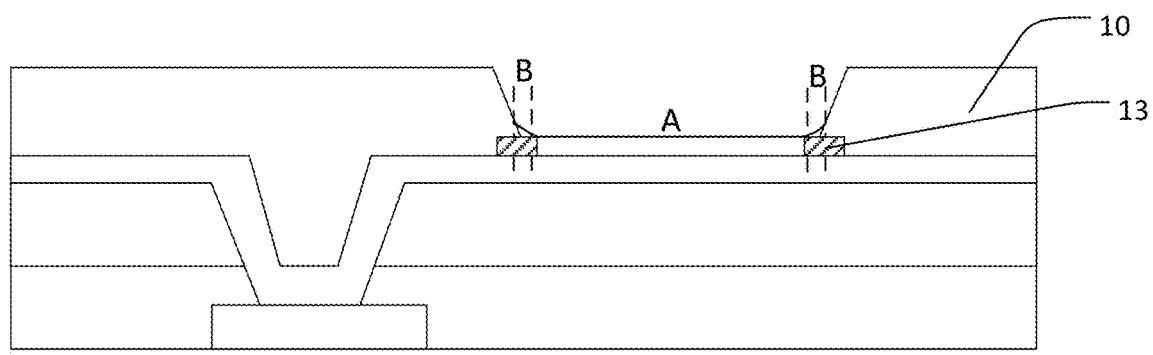
FIG. 3, Prior Art
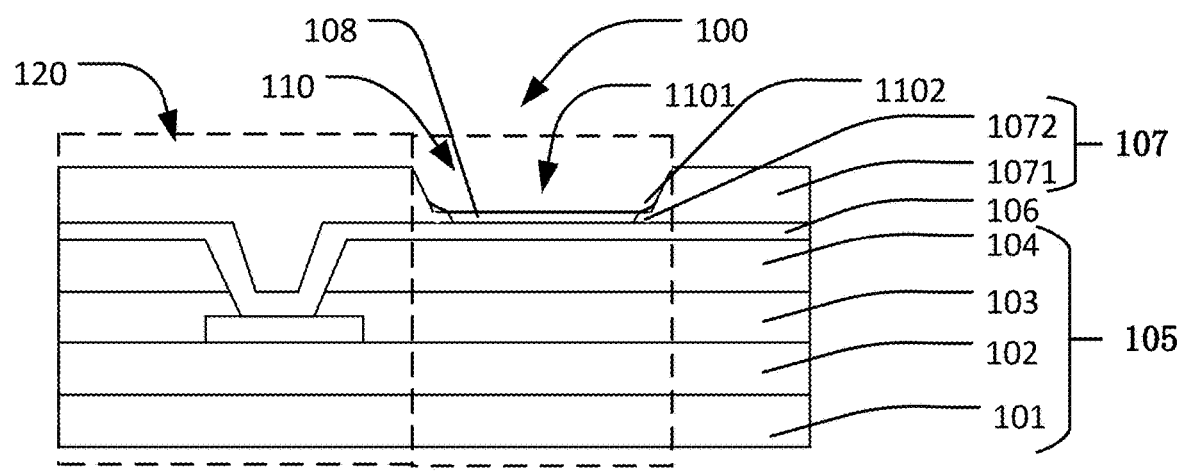
FIG. 4

DISPLAY PANEL AND METHOD OF MANUFACTURING THEREOF

BACKGROUND OF INVENTION

Field of Invention

The present invention relates to a field of display, and more particularly to a display panel and a method of manufacturing thereof.

Description of Prior Art

Currently, active-matrix organic light-emitting (AMOLED) display screens are mainly manufactured by inkjet printing technology. A column spacer has a specific pinning point during manufacturing the AMOLED display screens. As shown in FIG. 1, when the ink, that is organic luminescent material, is printed in the column spacer 10 (first defining region), and the ink is certainly raised within the slope of the column spacer after coating and baking.

For example, B region in FIG. 1 is a climbing region, and A region is a normal light emitting display region. The ink is raised to a height, which is related to the pinning point, and thus a thickness of the ink in the light emitting region is uneven, that is, the middle of the light emitting region is thin, and two sides of the light emitting region are thick. Thus, it causes edges and intermediate region of pixel emit unevenness light. That is, the A region is bright and the B region is dark. The A region and the B region have different current which results in different brightness. This pixel illumination unevenness also causes the illumination lifetime of the entire pixel region AMOLED to be reduced. As shown in FIG. 2, brightness of normal region is indicated by curve 11 and brightness of the B region is indicated by curve 12, and attenuation of curve 12 is 50% lower than the curve 11 prolonged with time.

As shown in FIG. 3, the solution to the problem in the prior art is to add a process, that is, vapor-depositing the silicon oxide layer 13 as a second defining material, which is referred to as a double-defined column spacer, and using a yellow-light process to remove the thicker edge of film. Thereby, the problem of uneven illumination and lifetime of the pixel are improved, but adding a new process like introducing hydrogen and oxygen, may cause the oxide thin film transistor to be electrically affected compared with the original thin film transistor. Therefore, it is urgent to provide a new display panel for solving the problem of uneven illumination of the pixel and improving stability of the display panel.

SUMMARY OF INVENTION

A display panel and a method of manufacturing thereof are provided. The pixel defining block is formed by one-time exposing the column spacer column and the bank with a halftone mask, thereby omitting the process of individually forming the bank, and manufacturing time and manufacturing cost are reduced, and thus the pixel region emits uniform light and the stability of the display panel is improved.

A display panel includes an array substrate, and the array substrate comprises a plurality of pixel regions, and each of the pixel regions comprise a light emitting region and a defined region surrounding the light emitting region; a first electrode disposed on the array substrate; and a plurality of pixel defining blocks disposed on a side of the first electrode away from the array substrate, and each of the pixel defining blocks comprises a column spacer and a bank, the column spacer corresponds to a gap of an adjacent pixel region, and the bank corresponds to the defined region of the pixel region.

In one embodiment, a cross-sectional shape of the column spacer is a trapezoid having a narrow top and a wide bottom, and material of the pixel defining block comprises hydrophobic organic photoresist.

In one embodiment, display panel further includes an organic functional layer disposed on the first electrode corresponding to the light emitting region and surrounded by the bank.

In one embodiment, the first electrode is an anode, and material of the first electrode comprises indium tin oxide.

In one embodiment, the array substrate includes a substrate, a thin film transistor layer disposed on the substrate, a passivation layer disposed on a side of the thin film transistor layer away from the substrate, and a planarization layer disposed on a side of the passivation layer away from the thin film transistor layer.

In one embodiment, the first electrode penetrates through the planarization layer and the passivation layer to the thin film transistor layer.

A method of manufacturing a display panel includes following steps: providing an array substrate having a plurality of pixel regions and a halftone mask, each of the pixel regions includes a light emitting region and a defined region surrounding the light emitting region; forming a first electrode on the array substrate; coating a photoresist on a side of the first electrode away from the array substrate; disposing the halftone mask above the photoresist; irradiating ultraviolet light through the halftone mask to a surface of the photoresist; forming a groove exposed on the surface of the first electrode by dropping a developing solution on the photoresist in the pixel region, and forming a pixel defining block on the photoresist where the developing solution is not dropped, and the pixel defining block includes a column spacer and a bank, the column spacer corresponds to a gap of an adjacent pixel region, and the bank corresponds to the defined region of the pixel region; and inkjet printing an organic functional layer in the groove of the first electrode.

In one embodiment, the halftone mask includes an opaque region, a transparent region, and a semi-opaque region.

In one embodiment, the opaque region corresponds to a gap of an adjacent pixel region; the transparent region corresponds to the light emitting region; and the semi-opaque region corresponds to the defined region, and the semi-opaque region has a transmittance of 15% to 50%.

In one embodiment, the groove has a groove bottom and a peripheral wall surrounding the groove bottom, and the bank is disposed on the groove bottom and the peripheral wall.

A display panel and a method of manufacturing thereof are provided. The pixel defining block is formed by one-time exposing the column spacer column and the bank with a halftone mask, thereby omitting the process of individually forming the bank, and manufacturing time and manufacturing cost are reduced. The organic functional layer disposed above the bank is not directly contacted with the first electrode due to the bank structure, and the bank causes the defined region to be disconnected from the first electrode, and no current flows through the defined region. Thus, the defined region does not emit light, and the pixel region emits uniform light. The material of the bank is an organic photoresist, so hydrogen and oxygen are not introduced into the bank, and therefore it does not affect the thin film transistor, and the stability of the display panel is improved.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

FIG. 1 is a schematic view of a column spacer used in a display panel of the prior art.

FIG. 2 is a graph showing the service life of a display panel in the prior art.

FIG. 3 is a schematic view of a display panel forming a double-defined column spacer in the prior art.

FIG. 4 is a schematic view of a display panel according to one embodiment of the present invention.

Figure 5:
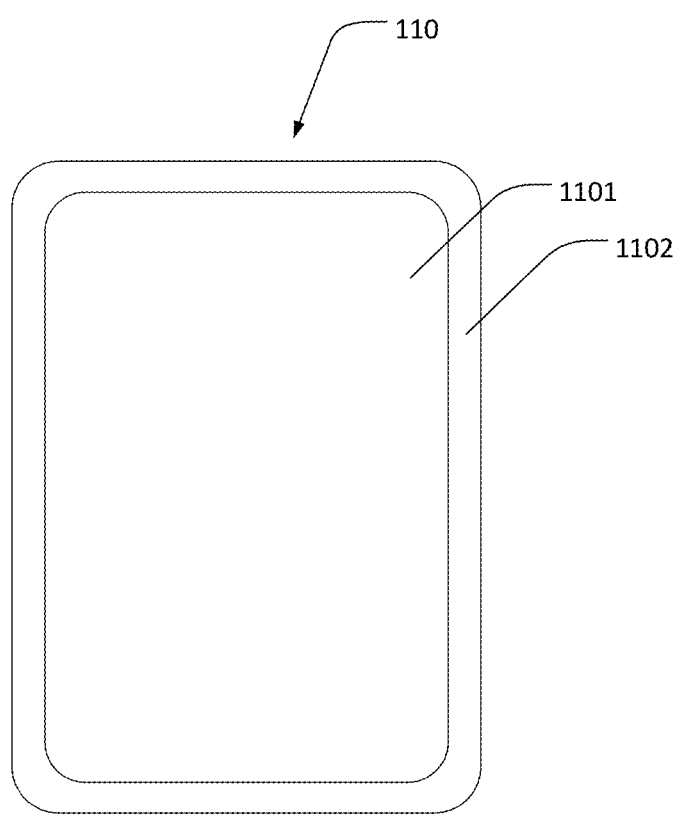
FIG. 5 is a plan view of a pixel region according to one embodiment of the present invention.

Elements: display panel 100; halftone mask 200; array substrate 105; first electrode 106; pixel defining block 107; organic functional layer 108; substrate 101; thin film transistor layer 102; passivation layer 103; planarization layer 104; column spacer 1071; bank 1072; pixel region 110; gap 120; light emitting region 1101; defined region 1102; opaque region 220; transparent region 210; a semi-opaque region 230; photoresist 130; groove 140; and ultraviolet light 30.

DETAILED DESCRIPTION OF PREFERRED EMBODIMENTS

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

Embodiments of the present invention are described in detail herein with reference to the drawings. The embodiments are carried out in various ways and are not to be construed as being limited to the specific embodiments set forth herein. The embodiments of the present invention are provided to explain the practical application, and thus those skilled persons in the art can understand various embodiments of the present invention and various modifications suitable for the particular intended application.

Referring to FIG. 4 and FIG. 5, a display panel 100 includes an array substrate 105, a first electrode 106, a plurality of pixel defining blocks 107, and an organic functional layer 108.

The array substrate 105 includes a plurality of pixel regions 110, and only one of the pixel region 110 is shown in FIG. 4. A gap 120 is disposed between two adjacent pixel regions 110. The pixel region 110 includes a light emitting region 1101 and a defined region 1102 surrounding the light emitting region 1101.

The array substrate 105 includes a substrate 101, a thin film transistor layer 102, a passivation layer 103, and a planarization layer 104.

The substrate 101 is a flexible substrate, and material of the flexible substrate includes polyimide, and the polyimide is used to make the substrate 101 have a flexibility The thin film transistor layer 102 is disposed on the substrate 101. The thin film transistor layer is an oxide thin film transistor. More specifically, the thin film transistor layer includes a first metal layer and a second metal layer, and the first metal layer is configured to form a gate trace, and the second metal layer is configured to form a source trace and a drain trace.

The passivation layer 103 is disposed on a side of the thin film transistor layer 102 away from the substrate 101. The planarization layer 104 is disposed on a side of the passivation layer 103 away from the thin film transistor layer 102.

The first electrode 106 is disposed on the array substrate 105. The first electrode 106 is an anode, and material of the first electrode 106 is indium tin oxide.

The first electrode 106 penetrates through the planarization layer 104 and the passivation layer 103 to the thin film transistor layer 102, and more particularly to the second metal layer first electrode 106. That is, the first electrode 106 is electrically connected to the thin film transistor layer.

Thus, the thin film transistor layer can drive the organic functional layer 108 to illuminate by the first electrode 106.

The pixel defining block 107 is disposed on a side of the first electrode 106 away from the array substrate 105.

The pixel defining block 107 comprises a column spacer 1071 and a bank 1072, and the column spacer 1071 corresponds to a gap 120 between two adjacent pixel regions 110, and the bank 1072 corresponds to the defined region 1102 of the pixel region 110.

A cross-sectional shape of the column spacer 1071 is a trapezoid having a narrow top and a wide bottom, and material of the pixel defining block 107 includes hydrophobic organic photoresist.

An organic functional layer 108 disposed on the first electrode 106 corresponding to the light emitting region 1101 and surrounded by the bank 1072. A portion of the organic functional layer 108 is also disposed above the bank 1072, but the organic functional layer 108 disposed above the bank 1072 is not directly contacted with the first electrode 106 due to the bank 1072 structure, and thus the defined region 1102 does not emit light, and the pixel region 110 emits uniform light. The material of the bank 1072 is an organic photoresist, so hydrogen and oxygen are not introduced into the bank 1072, and therefore it does not affect the thin film transistor.

In another embodiment, a method of manufacturing a display panel includes steps described as follows.

Figure 6:
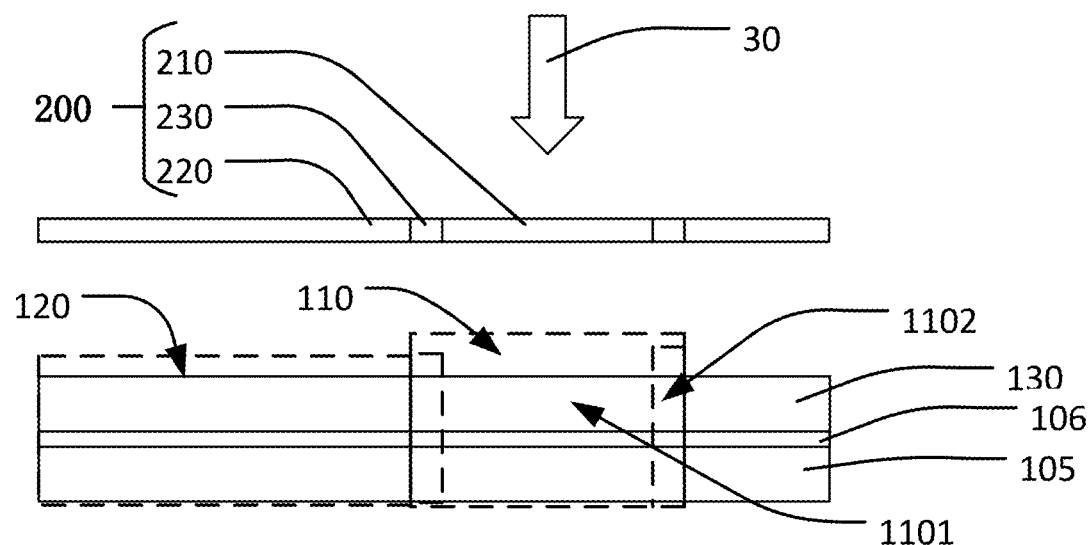
FIG. 6 is a schematic view of illumination of a mask plate according to one embodiment of the present invention.

Step S1, as shown in FIG. 6, providing an array substrate 105 having a plurality of pixel regions 110 and a halftone mask 200, and each of the pixel regions 110 includes a light emitting region 1101 and a defined region 1102 surrounding the light emitting region 1101.

The halftone mask 200 includes an opaque region 220, a transparent region 210, and a semi-opaque region 230.

The opaque region 220 corresponds to a gap 120 of an adjacent pixel region 110. The transparent region 210 corresponds to the light emitting region 1101. The semi-opaque region 230 corresponds to the defined region 1102, and the semi-opaque region 230 has a transmittance of 15% to 50%.

Step S2, forming a first electrode 106 on the array substrate 105, and the first electrode 106 is an anode, and material of the anode is made of indium tin oxide.

The first electrode 106 is electrically connected to a thin film transistor layer of the array substrate 105.

Step S3, coating a photoresist 130, which is a positive photoresist, on a side of the first electrode 106 away from the array substrate 105.

Step S4, disposing the halftone mask 200 above the photoresist 130.

Step S5, irradiating ultraviolet light 30 through the halftone mask 200 to a surface of the photoresist 130, and the ultraviolet light 30 is emitted from a side of the halftone mask 200 away from the display panel 100, and then the ultraviolet light 30 passes through the transparent region 210 and the semi-opaque region 230 to a surface of the photoresist 130.

Figure 7:
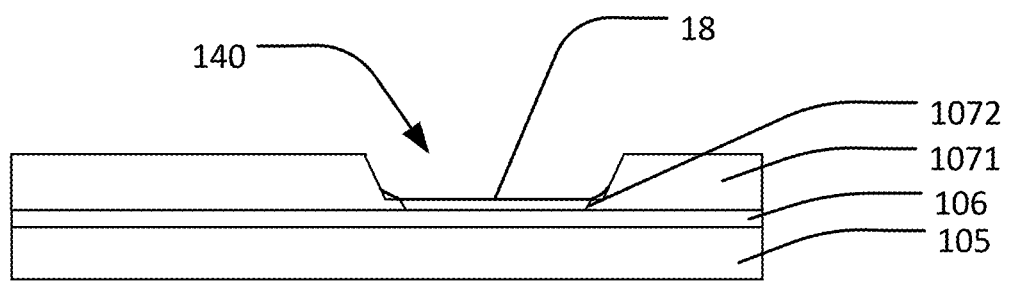
FIG. 7 is a schematic view of a display panel according to one embodiment of the present invention.

Step S6, as shown in FIG. 7, dropping a developing solution on the photoresist 130 in the pixel region 110 to form a groove 140 exposed on the surface of the first electrode 106, and forming a pixel defining block 107 on the photoresist 130 where the developing solution is not dropped.

The pixel defining block 107 includes a column spacer 1071 and a bank 1072. The column spacer 1071 corresponds to a gap 120 of an adjacent pixel region 110, and the bank 1072 corresponds to the defined region 1102 of the pixel region 110.

The groove 140 has a groove bottom and a peripheral wall surrounding the groove bottom, and the bank 1072 is disposed on the groove bottom and the peripheral wall.

Step S7, inkjet printing an organic functional layer 108 in the groove 140 of the first electrode 106. However, a portion of the organic functional layer 108 is also disposed above the bank 1072 during ink jetting.

Figure 8:
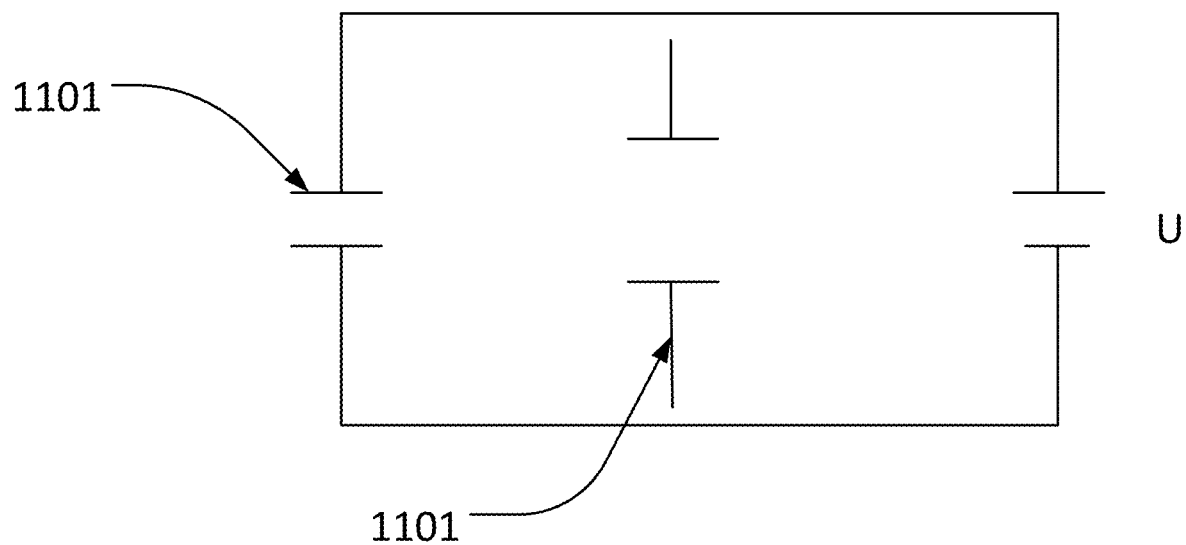
FIG. 8 is a circuit diagram of a pixel region according to one embodiment of the present invention.

The organic functional layer 108 disposed above the bank 1072 is not directly contacted with the first electrode 106 due to the bank 1072 structure. As shown in FIG. 8, the bank 1072 causes the defined region 1102 to be disconnected from the first electrode 106 in the equivalent circuit of the pixel region 110, and no current flows through the defined region 1102. Thus, the defined region 1102 does not emit light, and the pixel region 110 emits uniform light. The material of the bank 1072 is an organic photoresist, so hydrogen and oxygen are not introduced into the bank 1072, and therefore it does not affect the thin film transistor. Because the process of individually forming the bank 1072 is omitted, manufacturing time and manufacturing cost are reduced In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel, comprising:
   an array substrate, wherein the array substrate comprises a plurality of pixel regions, and each of the pixel regions comprise a light emitting region and a defined region surrounding the light emitting region;
   a first electrode disposed on the array substrate;
   a plurality of pixel defining blocks disposed on a side of the first electrode away from the array substrate; and
   an organic functional layer disposed on the first electrode corresponding to the light emitting region and surrounded by the bank;
   wherein each of the pixel defining blocks comprises a column spacer and a bank, the column spacer corresponds to a gap of an adjacent pixel region, and the bank corresponds to the defined region of the pixel region; and
   wherein the organic functional layer comprises a first organic light emitting sub-layer and a second organic light emitting sub-layer; the first organic light emitting sub-layer contacts with the first electrode, the second organic light emitting sub-layer is disposed on the bank, and the first organic light emitting sub-layer and the second organic light emitting sub-layer are separated from each other by the bank.

2. The display panel according to claim 1, wherein a cross-sectional shape of the column spacer is a trapezoid having a narrow top and a wide bottom, and material of the pixel defining block comprises hydrophobic organic photoresist.

3. The display panel according to claim 1, wherein the first electrode is an anode, and material of the first electrode comprises indium tin oxide.

4. The display panel according to claim 1, wherein the array substrate comprises:
   a substrate;
   a thin film transistor layer disposed on the substrate;
   a passivation layer disposed on a side of the thin film transistor layer away from the substrate; and
   a planarization layer disposed on a side of the passivation layer away from the thin film transistor layer.

5. The display panel according to claim 4, wherein the first electrode penetrates through the planarization layer and the passivation layer to the thin film transistor layer.

6. A method of manufacturing a display panel, comprising following steps:
   providing an array substrate having a plurality of pixel regions and a halftone mask, each of the pixel regions comprises a light emitting region and a defined region surrounding the light emitting region;
   forming a first electrode on the array substrate;
   coating a photoresist on a side of the first electrode away from the array substrate;
   disposing the halftone mask above the photoresist;
   irradiating ultraviolet light through the halftone mask to a surface of the photoresist;
   forming a groove exposed on the surface of the first electrode by dropping a developing solution on the photoresist in the pixel region, and forming a pixel defining block on the photoresist where the developing solution is not dropped, wherein the pixel defining block comprises a column spacer and a bank, the column spacer corresponds to a gap of an adjacent pixel region, and the bank corresponds to the defined region of the pixel region; and
   inkjet printing an organic functional layer in the groove of the first electrode;
   wherein the organic functional layer comprises a first organic light emitting sub-layer and a second organic light emitting sub-layer; the first organic light emitting sub-layer contacts with the first electrode, the second organic light emitting sub-layer is disposed on the bank, and the first organic light emitting sub-layer and the second organic light emitting sub-layer are separated from each other by the bank.

7. The method of manufacturing the display panel according to claim 6, wherein the halftone mask comprises an opaque region, a transparent region, and a semi-opaque region.

8. The method of manufacturing the display panel according to claim 7, wherein the opaque region corresponds to a gap of an adjacent pixel region;
the transparent region corresponds to the light emitting region; and
the semi-opaque region corresponds to the defined region, and the semi-opaque region has a transmittance of 15% to 50%.

9. The method of manufacturing the display panel according to claim 6, wherein the groove has a groove bottom and a peripheral wall surrounding the groove bottom, and the bank is disposed on the groove bottom and the peripheral wall.

\* \* \* \* \*